(12) United States Patent
Feil

(10) Patent No.: US 11,417,732 B2
(45) Date of Patent: Aug. 16, 2022

(54) SEMICONDUCTOR TRANSISTOR DEVICE AND METHOD OF MANUFACTURING THE SAME

(71) Applicant: Infineon Technologies Austria AG, Villach (AT)

(72) Inventor: Thomas Feil, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/919,337

(22) Filed: Jul. 2, 2020

(65) Prior Publication Data
US 2021/0005715 A1   Jan. 7, 2021

(30) Foreign Application Priority Data

Jul. 4, 2019 (EP) .................................. 19184395

(51) Int. Cl.
*H01L 29/10* (2006.01)
*H01L 29/08* (2006.01)
(Continued)

(52) U.S. Cl.
CPC ........ *H01L 29/1095* (2013.01); *H01L 29/086* (2013.01); *H01L 29/1045* (2013.01); *H01L 29/66734* (2013.01); *H01L 29/7802* (2013.01)

(58) Field of Classification Search
CPC .............. H01L 29/1095; H01L 29/086; H01L 29/1045; H01L 29/66734; H01L 29/7802;
(Continued)

(56) References Cited

U.S. PATENT DOCUMENTS

2006/0214222 A1\* 9/2006 Challa ............... H01L 21/31116
257/328
2010/0065905 A1    3/2010 Pan
(Continued)

FOREIGN PATENT DOCUMENTS

DE       102007044414 A1    3/2009
JP         2012191053 A      10/2012

OTHER PUBLICATIONS

Shao, Lin, et al., "Boron diffusion in silicon: the anomalies and control by point defect engineering", Reports: A Review Journal, Materials Science and Engineering R 42, Aug. 11, 2003, 65-114.

*Primary Examiner* — Shahed Ahmed
(74) *Attorney, Agent, or Firm* — Murphy, Bilak & Homiller, PLLC

(57) ABSTRACT

A semiconductor transistor device is described that has a source region, a body region including a vertical channel region, a drain region, a gate region laterally aside the channel region, a body contact region formed by doping, a diffusion barrier layer, and a conductive region formed of a conductive material. The body contact region electrically contacts the body region, the diffusion barrier layer being arranged in between. The doping of the body contact region is of the same conductivity type but of higher concentration than a doping of the body region. The conductive region has a contact area that forms an electrical contact to the body contact region, the contact area of the conductive region being arranged vertically above an upper end of the channel region. A method for manufacturing the semiconductor transistor device is also described.

18 Claims, 11 Drawing Sheets

(51) Int. Cl.
*H01L 29/66* (2006.01)
*H01L 29/78* (2006.01)

(58) Field of Classification Search
CPC . H01L 29/407; H01L 29/404; H01L 29/0865; H01L 29/0603; H01L 29/0684; H01L 29/66477; H01L 29/66613–66628; H01L 29/7813; H01L 29/7825; H01L 29/42366; H01L 29/42352; H01L 29/32; H01L 29/417; H01L 29/78; H01L 27/0711–0722; H01L 29/66325–66348; H01L 29/7393–7398
See application file for complete search history.

(56) References Cited

U.S. PATENT DOCUMENTS

| | | | | |
|---|---|---|---|---|
| 2010/0117144 A1* | 5/2010 | Hirler | ............... | H01L 29/66734 257/330 |
| 2012/0302050 A1* | 11/2012 | Matsui | ................ | H01L 21/2257 438/559 |
| 2015/0255586 A1 | 9/2015 | Naijo | | |
| 2015/0270378 A1* | 9/2015 | Konishi | ............ | H01L 21/76224 257/139 |
| 2017/0018457 A1* | 1/2017 | Schulze | .............. | H01L 29/0615 |

\* cited by examiner

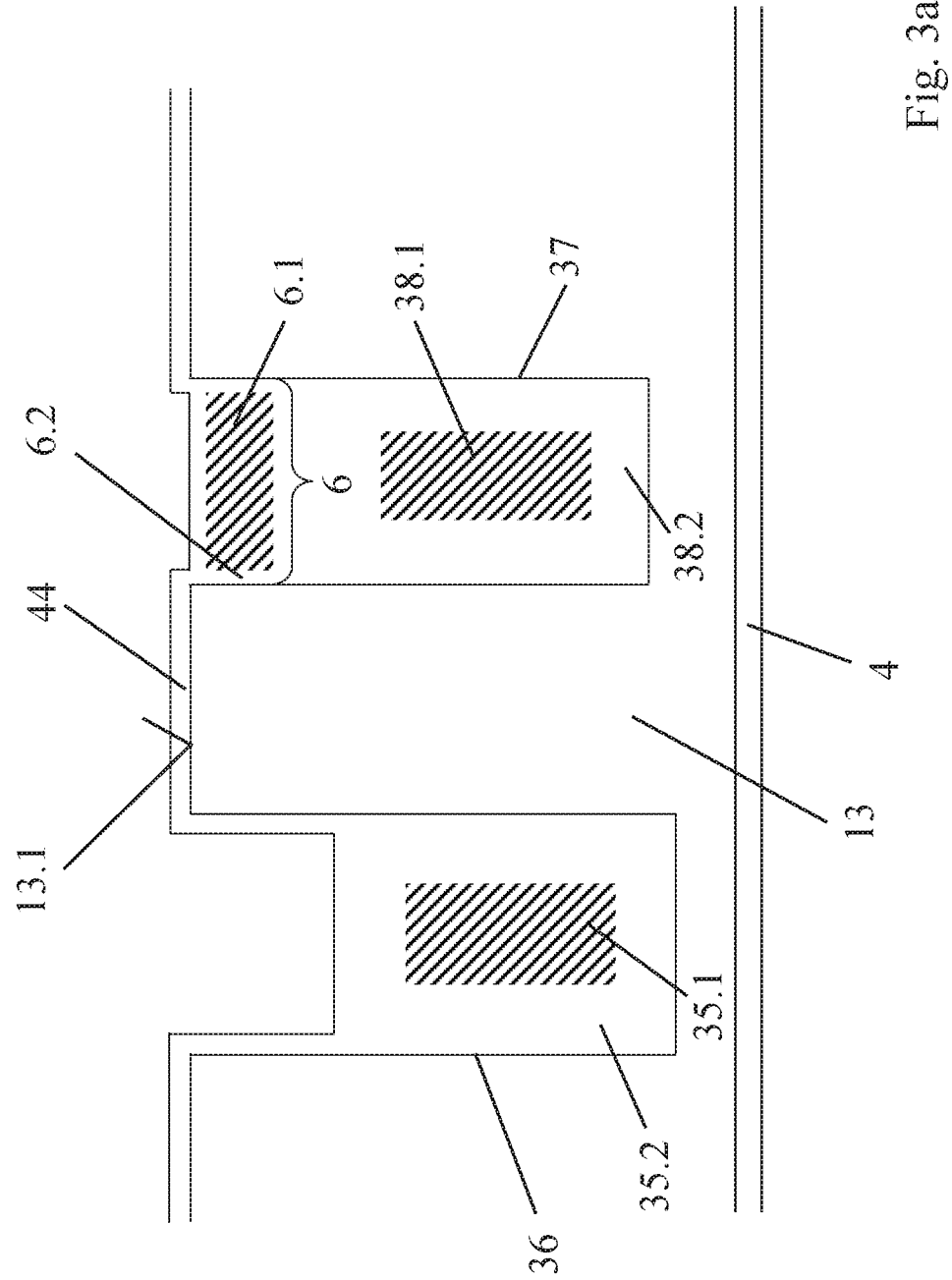

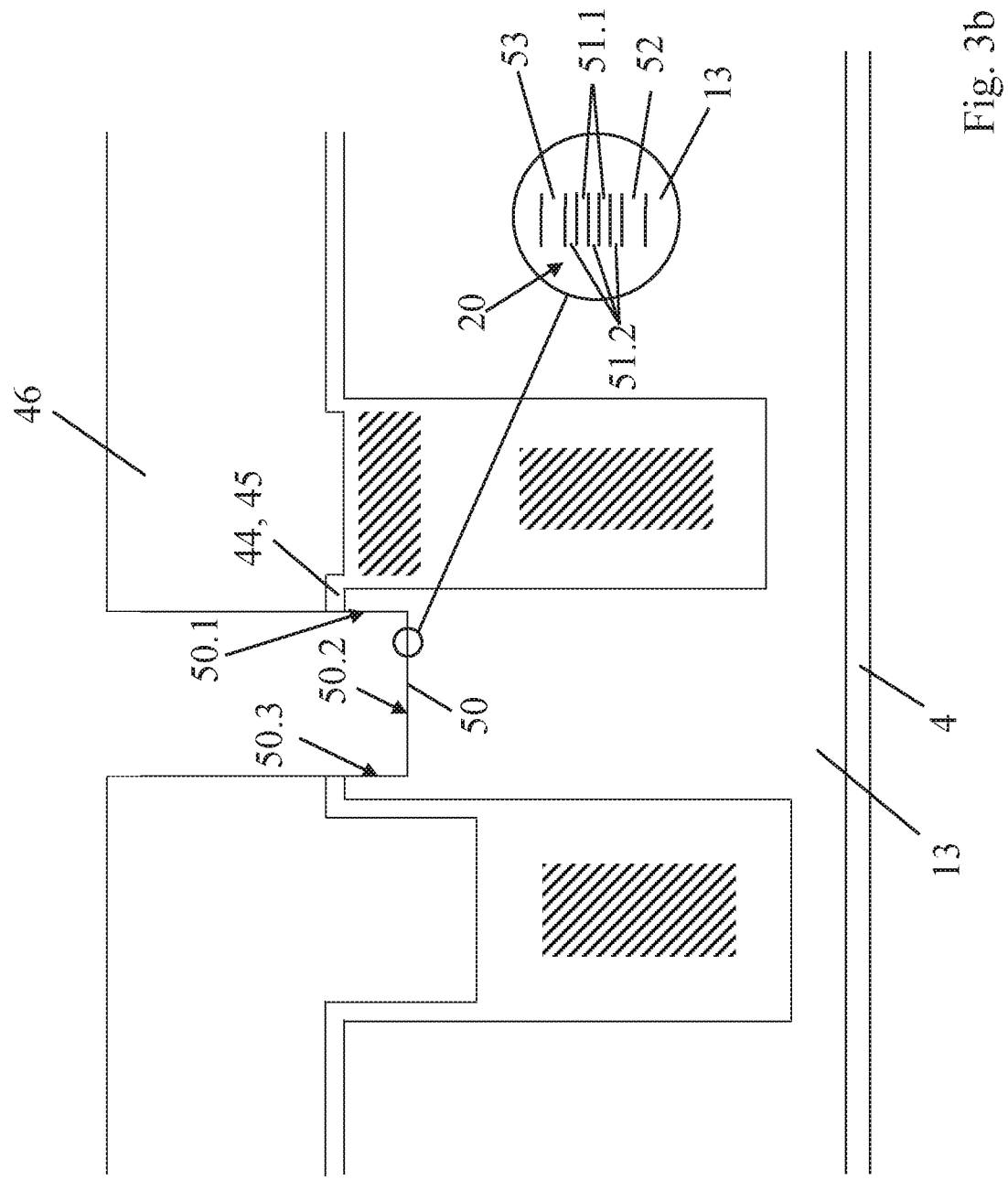

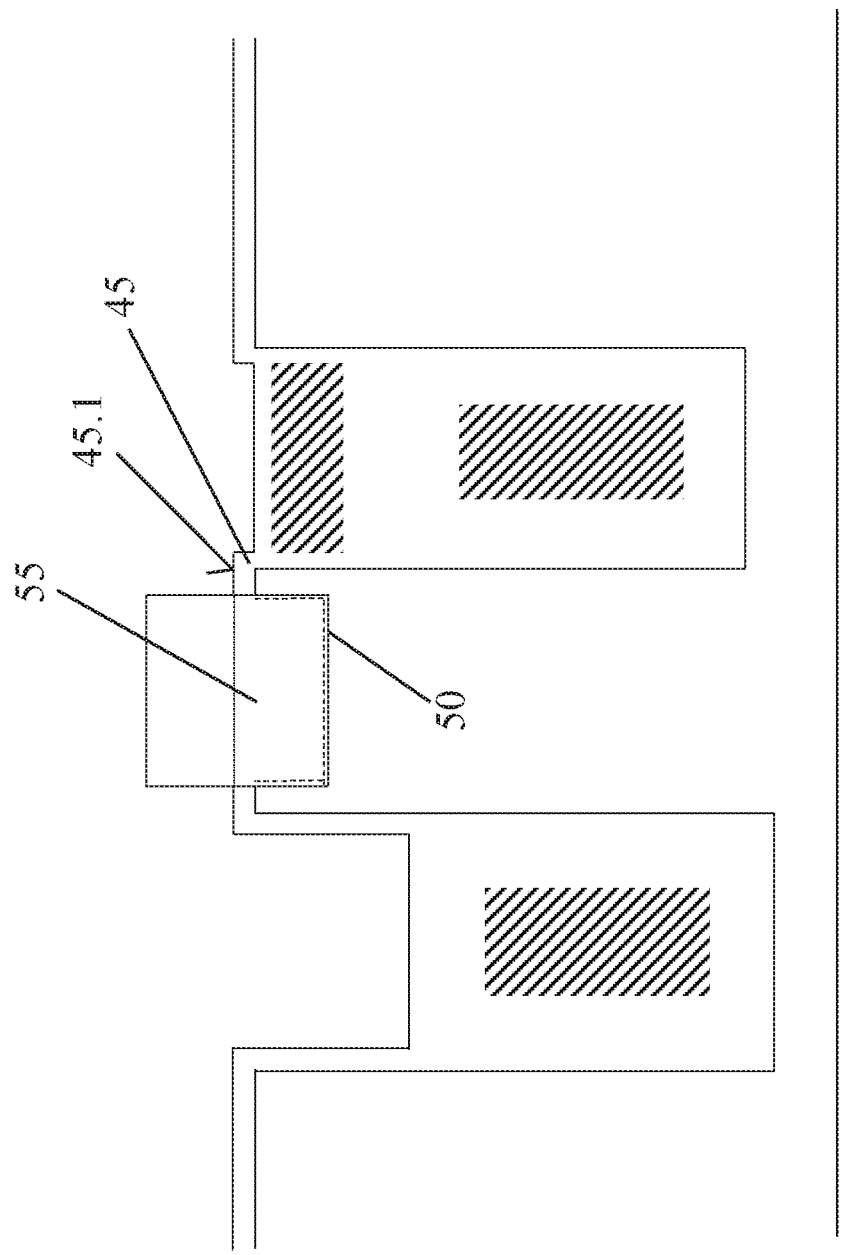

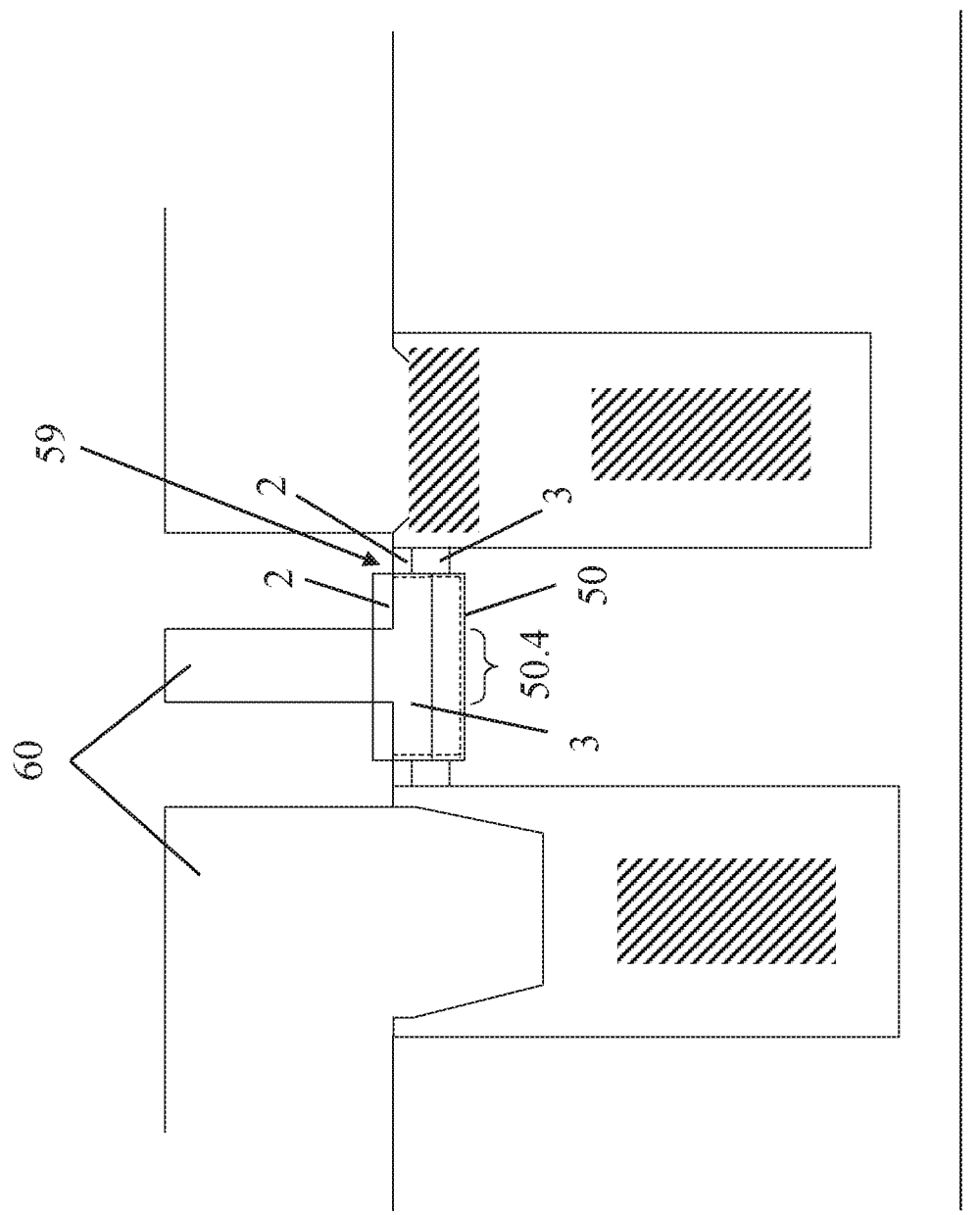

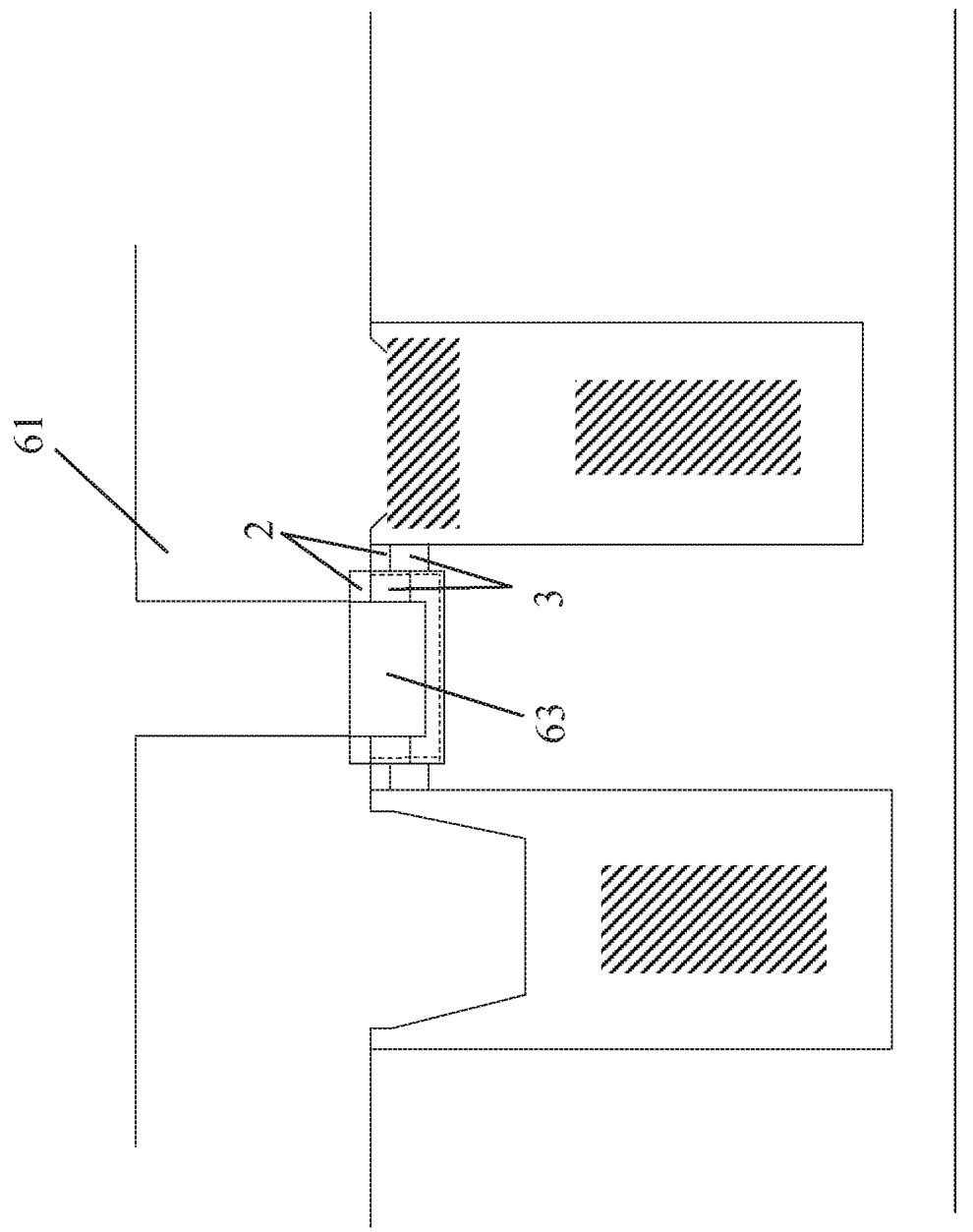

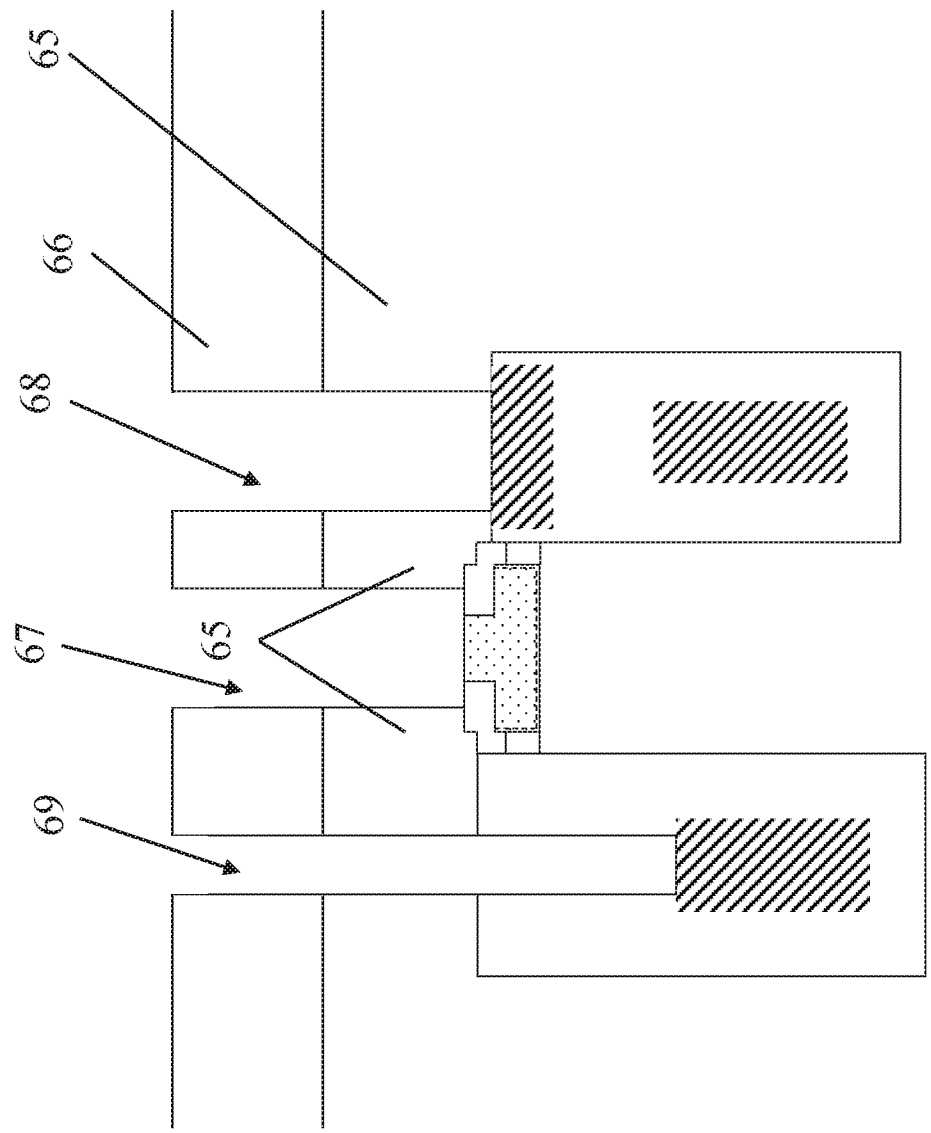

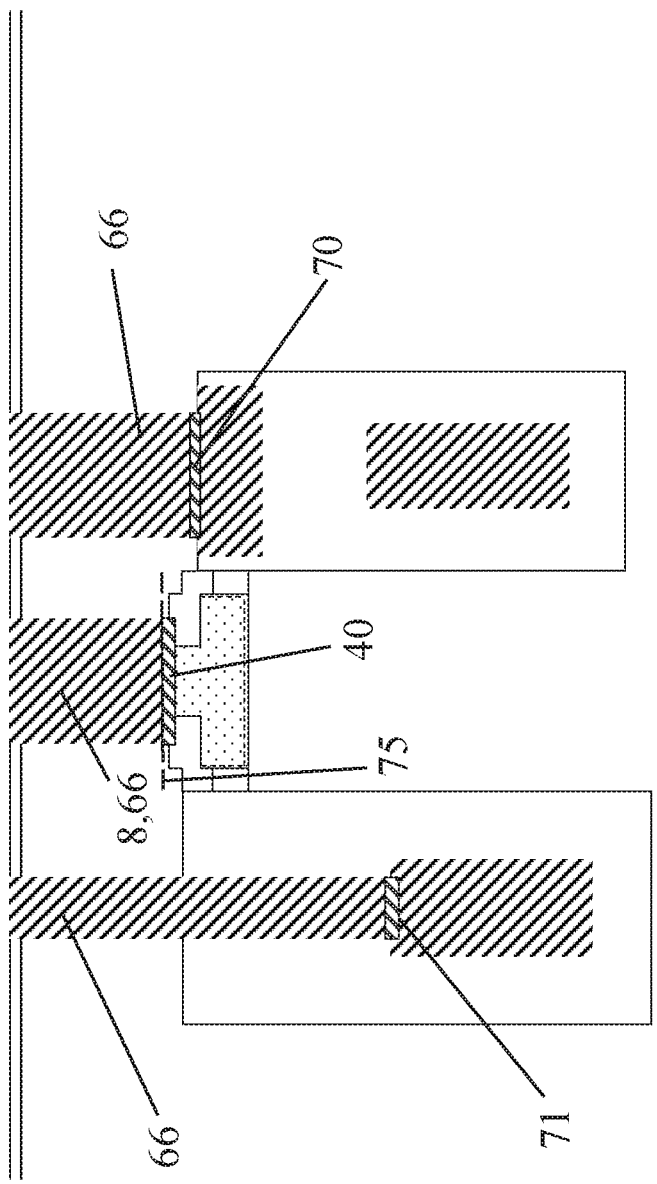

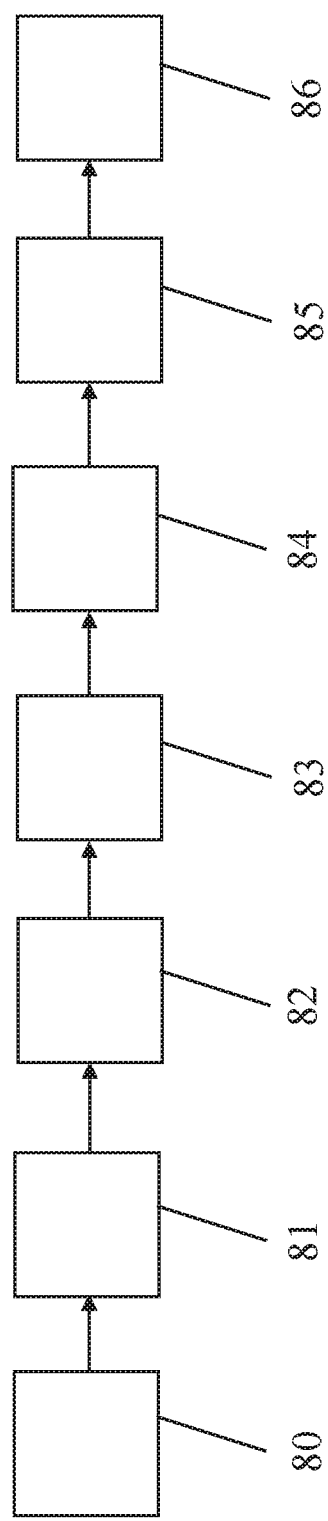

SEMICONDUCTOR TRANSISTOR DEVICE AND METHOD OF MANUFACTURING THE SAME

TECHNICAL FIELD

The present invention relates to a semiconductor transistor device comprising a vertical channel region formed in a body region and a gate region laterally aside the channel region.

BACKGROUND

In a vertical field effect transistor, a vertical channel region is formed in the body region. Laterally aside, the gate region is arranged, comprising a gate interlayer dielectric and a gate electrode. In the channel region, a channel electrically connecting the source and the drain region is or can be formed, which can be controlled by applying a voltage to the gate electrode. To avoid a floating body region, it is electrically contacted. The body region can for instance be shorted to the source region to eliminate an intrinsic parasitic npn transistor, in particular in a power device.

SUMMARY

It is an object of the present application to provide a vertical transistor device with improved characteristics, as well as a method of manufacturing such a device.

In one embodiment, the device comprises a body contact region formed by doping of the same conductivity type like the body region, but with a higher concentration. The body region can be electrically contacted via the body contact region, wherein a diffusion barrier layer is arranged in between these regions. This can limit an outdiffusion of the high dose implant, allowing for example a comparably precise positioning of the body contact region with respect to the body region, e.g. close to the channel region. This can be advantageous in terms of the device characteristics, see in detail below.

Furthermore, the device comprises a conductive region formed of a conductive material, for instance a metal material filler, e.g. a tungsten plug. Via a contact area of the conductive region, an electrical contact to the body contact region is formed. This contact area is arranged vertically above an upper end of the channel region. In simple words, the conductive region is arranged above the body contact region and does not extend down into the body region. Vice versa, the body contact region arranged below the conductive region can have a certain vertical extension, e.g. at least the height of the vertical channel region. This can for example be advantageous in terms of a contact formation between the conductive region and the body contact region, namely allow for a reliable contact while avoiding a leakage, see in detail below.

Further embodiments and features are provided in this description and in the dependent claims. Therein, the individual features shall be disclosed independently of a specific claim category, the disclosure relates to apparatus and device aspects, but also to method and use aspects. If for instance a device manufactured in a specific way is described, this is also a disclosure of a respective manufacturing process, and vice versa. In general words, an idea of this application is to provide a semiconductor device, in particular a field effect transistor, with a body contact region having a higher doping concentration than the body region, the body contact region being defined by a diffusion barrier structure comprising one or a plurality of diffusion barrier layers.

The source and the drain region of the device are of a first conductivity type, the body region and the body contact region are of a second conductivity type opposite to the first conductivity type. As a power device, the transistor can comprise a drift region vertically between the body and the drain region, wherein the drift region is of the first conductivity type like the drain region but has a lower doping than the latter. In the illustrated embodiments, the first conductivity type is n-type and the second conductivity type is p-type. The dopant concentration in the body contact region can be significantly larger than in the body region, for instance by at least one order of magnitude, typical values being for instance 2-3 orders of magnitude. The doping concentration in the body contact region can for example be at least 1 E19 $cm^3$, in particular at least 5 E19 $cm^3$ or 1 E20 $cm^3$, with possible upper limits of for example 1E21 $cm^3$ or 5 E20 $cm^3$.

As discussed above, the conductive region can for instance be a metal material filler. Such a filler can be deposited into a contact hole etched into an interlayer dielectric covering the body contact region, see below. Over its vertical extension, the conductive region can be formed of the same continuous material (bulk material), e.g. as a tungsten plug. The bulk material of the conductive region forms the contact area, namely at a lower end of the conductive region. In particular, a lower end of a tungsten plug can form the contact area. The contact area forms the electrical contact towards the body contact region, it does not necessarily rest directly adjacent on the body contact region. To assure a low ohmic contact, for instance a silicide layer can be arranged in between. Nevertheless, a vertical distance between the contact area and the body contact region will remain rather small, possible upper limits being for instance not more than 100 nm, 80 nm, 60 nm or 30 nm (lower limits are for instance at least 5 nm or 10 m).

The gate region comprises a gate electrode and a gate dielectric, in particular gate oxide, for instance silicon oxide. The gate electrode is the electrical conductive part of the gate region, it is capacitively coupled to the channel region via the gate dielectric. The gate electrode may for instance be made of metal or polycrystalline silicon. The gate region can be arranged in a gate trench etched into the silicon material (the gate dielectric can be formed at the sidewall of the trench, the gate electrode can be deposited into the trench, filling it at least partly). Optionally, a field plate can be provided in the gate trench below the gate electrode (split gate), isolated therefrom by an interlayer dielectric.

Alternatively or in addition to such a split gate, the device can comprise field electrode regions which extend vertically into the drift region and are formed in field electrode trenches (separate from the gate trenches). Seen in a sectional view, the field electrode and the gate trenches can alternate in a horizontal direction. The field electrode trenches can be strip-like structures extending parallelly to the gate trenches. Alternatively, the field electrode trenches can be needle trenches, the field electrode regions having a specular or columnar shape. In this case, the gate trenches can form a crisscross or check pattern seen in a top view, the needle trenches being arranged in the spaces between.

The "vertical" direction lies perpendicular to a surface of a layer of the device, for instance a surface of a silicon substrate and/or a surface of an epitaxial layer (deposited on the substrate) and/or a surface of an interlayer dielectric, on which a frontside metallization is deposited, and/or a surface of the frontside metallization itself. The horizontal/lateral directions lie perpendicular to the vertical direction, the device/chip area is for instance taken laterally/horizontally. "Upper" and "lower" refer to the vertical direction, a vertical trench extends for instance in the vertical direction from an upper surface down into the silicon material. "Lying vertically above/below" means lying on a higher/lower level with respect to the vertical direction (in general, it shall not imply an alignment in the vertical direction).

At the frontside of the device, above the source/drain/channel region, a frontside metallization can be provided, for instance a combined source/body contact. The drain contact can be provided at the backside of the device. Alternatively, the drain connection can be routed from the bottom of the drift region to the frontside of the device by vertical conduction, for instance via an $n^+$-sinker. In this case, a separate frontside metal contact will be provided. As a power device, the transistor can for instance have a breakdown voltage of at least 10 V, 20 V, 30 V or 40 V, with possible upper limits of for instance not more than 800 V, 600 V, 400 V, 200 V or 100 V.

In an embodiment, the contact area of the conductive region, which forms the electrical contact towards the body contact region, is arranged at an upper end of the source region. In this case, the conductive region can be formed above the body/source region without any etching into the body contact region material (e.g. epitaxially grown silicon, see below) deposited after the formation of the diffusion barrier layer. Even though the diffusion barrier layer and body contact region formation may involve a body contact trench etch beforehand, this can be better or easier in terms of a position control compared to a rather narrow trench etched into the body contact region later on. A vertical distance between the contact area and the upper end of the source region can for instance be not more than 50 nm or 20 nm (they can also lie exactly on the same height).

In an embodiment, the contact area of the conductive region lies as a whole in a horizontal plane. In other words, the contact area is flat and extends horizontally. The horizontal plane lies vertically above the upper end of the channel region, in particular at an upper end of the source region. In general, however, the contact area could also extend over a step resulting for instance from the deposition of the body contact region material.

In an embodiment, the body contact region is arranged laterally aside the body region with the vertical channel region. Consequently, the diffusion barrier layer arranged in between the body region and the body contact region extends vertically (seen in a vertical cross-section). As a whole, the diffusion barrier structure can comprise a horizontal diffusion barrier layer nevertheless, see in detail below. By arranging the body contact region laterally aside the body/channel region, the high dose implant can be brought close to the channel, which can be advantageous in terms of a shielding from the high potential of the drain. Vice versa, the defined lateral positioning achieved by the diffusion barrier layer can help maintaining a minimum distance to prevent the channel from being pinched off, which could for instance result in a strong dependence of the threshold voltage.

At least a lower part of the body contact region lies aside the channel region, depending on the height of the body contact region an upper part thereof can extend further upward. In an embodiment, the diffusion barrier layer and the body contact region, namely at least the lower part thereof, extend vertically over the whole height of the channel region. In other words, the body contact region electrically contacts the body region over the whole height of the channel region (with the diffusion barrier layer in between).

In an embodiment, the diffusion barrier layer is arranged at a lateral distance of not more than 80 nm from the channel region, further possible upper limits being not more than 70 nm, 60 nm or even only 55 nm. Possible lower limits of the lateral distance are for instance at least 35 nm, 40 nm or 45 nm. The channel region can for instance have a vertical height of 100 nm at maximum, further possible upper limits being for instance not more than 90 nm, 80 nm, 70 nm or 60 nm. Possible lower limits of the vertical channel height are for instance at least 30 nm or 35 nm.

As mentioned already, the diffusion barrier layer can belong to a diffusion barrier structure defining the body contact region also in other directions. Assuming that the diffusion barrier layer between the body and the body contact region extends vertically, namely is arranged laterally aside the body region, the diffusion barrier structure can comprise an additional barrier layer extending horizontally and defining the body contact region vertically downwards. In particular, this horizontal diffusion barrier layer can be formed directly on an upper surface of the drift region. In other words, the body region does not extend below the body contact region, the latter rests on the drift region (with the horizontal barrier layer in between). The horizontal barrier layer can prevent an outdiffusion of the highly concentrated dopant into the structure below.

Seen in a vertical cross-section, the cell with the body/source regions can generally have a symmetrical design (the sectional plane can lie perpendicular to a lateral length extension of the body contact trench). Therein, a second body region comprising a second channel region can be arranged laterally opposite to the first body region with the first channel region. The second body region can be contacted by the same body contact region, with a layer of the diffusion barrier structure arranged in between. Consequently, the body contact region can be defined in a first horizontal direction by the first vertical barrier layer towards the first body region, and it can also be defined in a second horizontal direction opposite to the first horizontal direction by a second vertical barrier layer. In addition, it can be defined vertically downwards by the horizontal barrier layer, so that the body contact region is contained in a trough formed by the barrier layers. Therein, even though the barrier layers are referred-to individually in the discussion of their position and orientation, they can be deposited in the same process step (they can be formed simultaneously at the bottom and sidewalls of the body contact trench, see below).

In an embodiment, the layer or layers of the diffusion barrier structure comprise alternating sublayers of silicon and oxygen-doped silicon. The oxygen-doped silicon sublayers can respectively have a thickness in the atomic range (e.g. one or several atoms thick) or in the nanometer range to ensure sufficient crystal information for growing the silicon. The oxygen concentration in the oxygen-doped silicon sublayers can be comparably low, for instance below 5 E14 $cm^3$. The alternating sublayers can for example be formed by silicon epitaxy with an absorption of oxygen at different steps. In general, as an alternative, the barrier layer(s) could for instance be formed by a co-implantation of a carbon component.

The application also relates to a method for manufacturing a semiconductor transistor device, comprising the steps:
i) forming the diffusion barrier layer,
ii) doping the body contact region with the same conductivity type but a higher concentration than the body region,
iii) depositing the conductive material for forming the conductive region and the contact area.

Therein, the doping of the body contact region can be a doping of a silicon region formed before, e.g. a doping of epitaxial silicon deposited before without any doping at all (see below). Alternatively or in addition, the silicon material can also be doped in situ during the deposition, in particular during the epitaxial growth. For instance, a body contact trench etched before can be refilled with a high doping concentration during the overgrowth already, e.g. a high concentration of boron.

Prior to the forming of the diffusion barrier layer in step i), a body contact trench can be etched into a silicon region. In the ready-made device, the body and source region are arranged in this silicon region. When the body contact trench is etched, the body and source implants can be in place already. Alternatively, the body and/or source implantation can be performed after the body contact trench etch, as explained in detail below. Independently of these details, the layer or layers of the diffusion barrier structure are deposited or formed after the body contact trench etch. They can be formed at a sidewall of the trench, in particular at each of its sidewalk lying horizontally opposite to each other. In the same process step, a horizontal barrier layer can be formed at the bottom of the trench.

After the formation of the diffusion barrier structure in the body contact trench, the trench can be filled up by epitaxially grown silicon. A mask used for defining the body contact trench etch can remain in place during the formation of the diffusion barrier structure and it can also stay in place thereafter when the trench is filled with silicon again. The mask used for the body contact trench etch can comprise a photoresist and a hard mask below, formed of an interlayer dielectric material. In particular, a gate interlayer dielectric material deposited before for forming the gate region in the gate trench can be used as a hard mask for the body contact trench etch. This can reduce the overall number of process steps. Alternatively, a separate hard mask could be deposited for the body contact trench etch.

After the refill of the body contact trench, the epitaxially grown silicon can project vertically above the upper ends of the sidewalls of the body contact trench, namely above the silicon region into which the trench has been etched. In case that a lithography mask was in place during the epitaxial growth, the epitaxial silicon can project even above the hard mask. By a planarization, for instance by chemical mechanical polishing (CMP), some of the epitaxial silicon can be removed thereafter.

During the planarization, the hard mask used for the body contact trench etch before can remain in place. This can for instance protect other structures of the device, like the gate region or field electrode regions. Thereafter, the hard mask can be etched back, so that for example a defined screen oxide can be deposited for a subsequent implantation (see below). In consequence, there can remain a vertical step, namely between a silicon region, which is arranged laterally between the diffusion barrier layer and the gate region, and the silicon refill of the body contact trench. The height of the step can correspond to the thickness of the hard mask used before, in particular to the thickness of the gate interlayer dielectric deposition.

In an embodiment, the body contact trench is refilled with epitaxially grown silicon deposited undoped. The body contact region is formed thereafter by implantation into this epitaxial silicon. Prior to the implantation, a screen oxide can be deposited (see above), which can suppress a channelling during the implantation.

In general, the body and the source region could be formed prior to the body contact trench etch, so that the trench would be etched into the p- and n-doped silicon material. In combination with an in situ doped refill of the body contact trench, no implantations would be required after the refill in this case.

In an alternative embodiment, the body and the source region are implanted after the body contact trench has been etched and the diffusion barrier structure has been formed. The trench can be refilled with or without an in situ doping, the body and the source region are formed after the refill. In case that the doping of the body contact region is performed after the refill (e.g. undoped refill), this high dose implant can in particular be performed after the body doping, and optionally also after the source doping. Having the high dose implant at the end can for instance save a thermal anneal in between.

The body implantation can be performed without a mask, for the source implantation a source mask (e.g. photolithography) shielding a central portion of the body contact trench from the source implant can be used, restricting the source implant to a region adjacent to the gate trench (forming a source pocket there). In particular, the so-defined source region can extend laterally across the step discussed above. The central portion shielded from the source implant can for instance have a width of around 100 nm (with photolithography only, could for example be narrowed with an additional oxide layer below the screen oxide). Alternatively to a photoresist layer, for instance an oxide plug could be formed above the central portion of the trench to avoid an implantation below the plug. If the body contact region is implanted after the refill, a body contact mask (e.g. photolithography) can restrict this implantation to a portion of the body contact trench, maintaining a certain lateral distance from the vertical layers of the diffusion barrier structure, such that the high dose implant is continued inside the diffusion barrier structure.

Independently of the sequence in detail, all implantations can be performed prior to the deposition of an interlayer dielectric, on which the front side metallization is placed thereafter. Prior to a deposition of the frontside metallization, a contact hole can be etched into the interlayer dielectric to contact the body contact region and the source region. A further contact hole can be etched to contact the gate electrode and, if applicable, a field electrode. The contact hole or holes can be filled with a metal material filler, for instance tungsten. To assure a good electrical contact, a silicide layer can be formed below the metal material filler. For that purpose, a silicide formation layer is deposited prior to the metal material filler (the silicide can be formed by letting diffuse metal atoms out of this layer).

To form titanium silicide for instance, the silicide formation layer can be a titanium or titanium/titanium nitride layer, deposited for example by sputtering. In a subsequent thermal treatment, the silicide will form where the silicide formation layer is in contact with silicon (doped silicon or polysilicon). Consequently, a silicide layer will form at the upper surface of the body contact region. Therein, with a progressing silicide formation, this silicide layer will increasingly extend into the body contact region. In this respect, the arrangement of the contact area above the upper end of the channel region, which assures a sufficient height of the body contact region material below (see above), can allow for a stable process window. In terms of the electrical contact, a sufficiently thick silicide layer can be formed, while a penetration of the silicide down into the drift region is avoided.

BRIEF DESCRIPTION OF THE DRAWINGS

Below, the transistor device and the manufacturing of the same are explained in further detail by means of exemplary embodiments. Therein, the individual features can also be relevant for this application in a different combination.

FIGS. 3a-h illustrate the manufacturing of the device of FIG. 1 in different process steps;

FIG. 4 illustrates the manufacturing of the transistor device in a block diagram.

DETAILED DESCRIPTION

Figure 1:
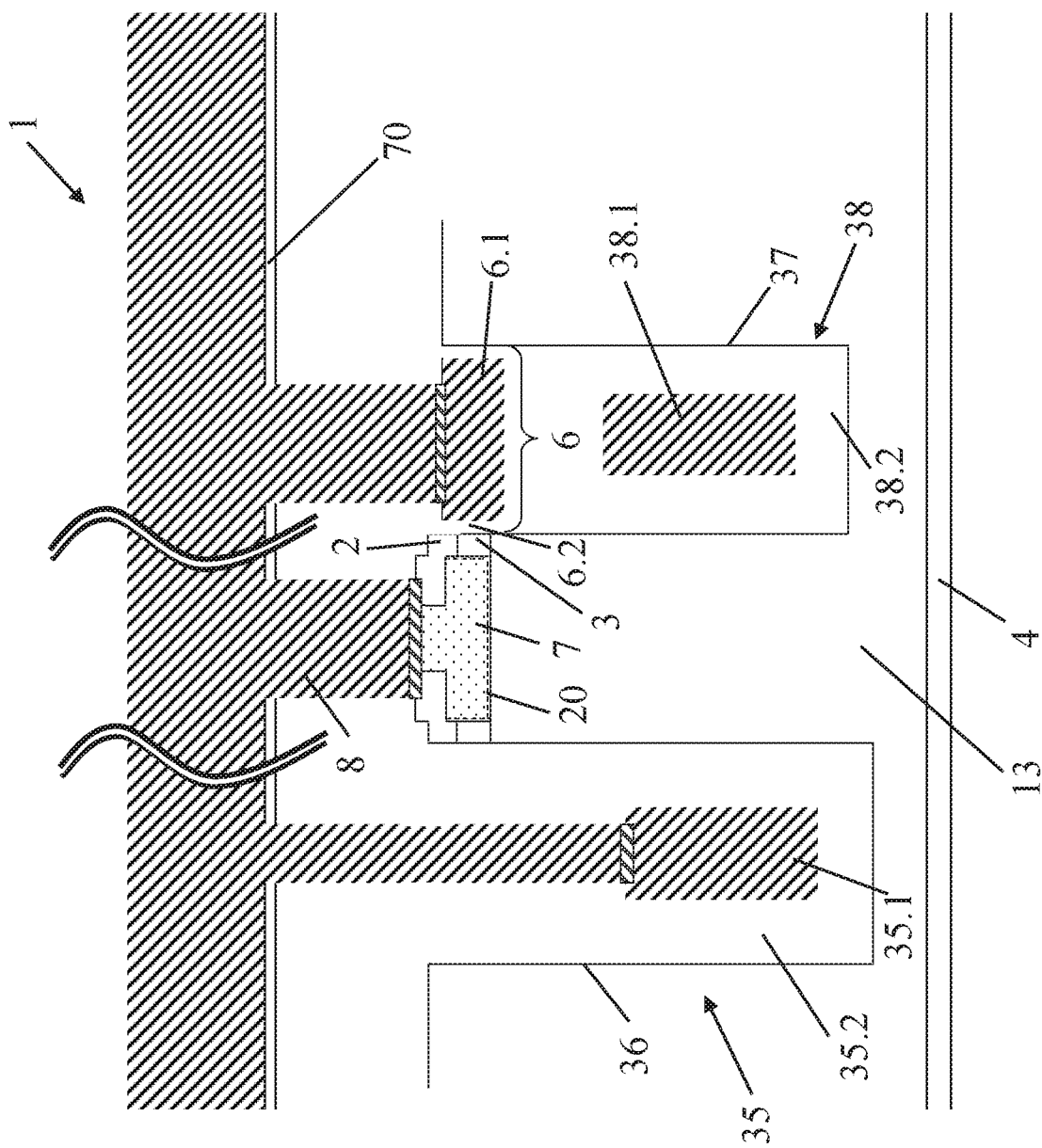
FIG. 1 shows a transistor device with a body contact region according to this disclosure in a sectional view.

FIG. 1 shows a semiconductor transistor device 1 comprising a source region 2, a body region 3, a drain region 4 and a gate region 6. The gate region 6 is arranged laterally aside the body region 3, it comprises a gate electrode 6.1 and a gate dielectric 6.2. The gate dielectric 6.2, e.g. gate oxide, capacitively couples the gate electrode 6.1 to the body region 3. By applying a voltage to the gate electrode 6.1, a channel can be formed in a channel portion 3.1 of the body region 3, see also FIG. 2.

Vertically between the body region 3 and the drain region 4, a drift region 13 is arranged. It is doped with the same conductivity type but a lower concentration than the drain region 4. In this example, the source region 2, the drift region 13 and the drain region 4 are n-type regions, and the body region 3 is a p-type region. To contact the body region 3, a body contact region 7 is provided, which is formed by doping (in situ during the deposition or thereafter, see below). The body contact region 7 has the same conductivity type but a higher doping than the body region 3, in this example a high dose boron doping. To avoid an outdiffusion of this high dose implant, it is contained in a diffusion barrier structure 20, see FIG. 2 in detail.

Figure 2:
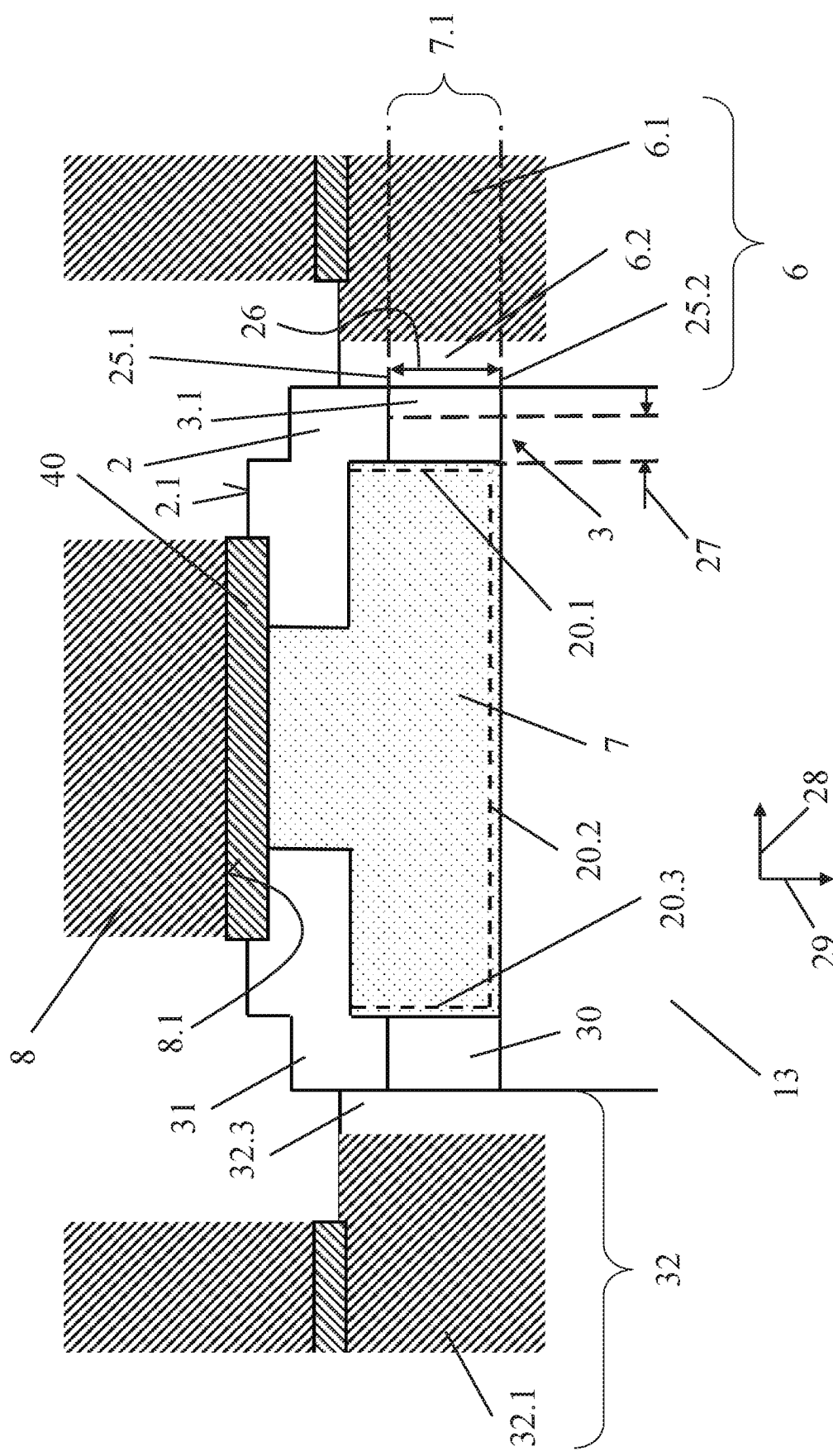
FIG. 2 shows the body contact region of a device according to this disclosure in a more detailed view.

The diffusion barrier structure 20 comprises a vertical diffusion barrier layer 20.1 arranged between the body contact region 7 and the body region 3. It prevents an outdiffusion in the first horizontal direction 28. Further it comprises a horizontal diffusion barrier layer 20.2 preventing an outdiffusion vertically downwards into the drift region 13 (in the vertical direction 29), and it comprises a further vertical diffusion barrier layer 20.3 defining the body contact region 7 horizontally in the opposite direction. The sectional view of FIG. 2 illustrates a symmetrical setup in the active region of the device 1, laterally opposite to the body region 3 another body region 30 and another source region 31 are formed. They are arranged at a gate region 32 comprising a gate electrode 32.1 and a gate dielectric 32.2.

In FIG. 1, a field electrode region 35 arranged in a field electrode trench 36 is shown in addition. The field electrode region 35 comprises a field electrode 35.1, e.g. formed of polysilicon, and an interlayer dielectric 35.2 isolating it from the drift region 13. The field electrode region 35 can for example allow for a field shaping, e.g. controlling the location of peak electric fields and preventing avalanche or hot carrier generation. The field electrode region 35 can also be used as an edge termination defining the active area of the device 1 laterally. In this case, typically, no source region 2 would be formed adjacent to the field electrode trench 36 (unlike shown in the figure). Between an edge termination field region on one lateral side of the device 1 and another edge termination field region on the opposite side, the active area extends, formed by instance of a plurality of symmetrical cells as shown in FIG. 2. However, field electrode regions 35 could also be arranged inside the active area of the device 1, alternating with the gate regions 6 in the lateral direction 28 (seen in a vertical cross section through the active area).

As can be seen in FIG. 1, the gate region 6 is formed in a gate trench 37. In the example shown here, a field plate region 38 is arranged in the gate trench 37 below the gate region 6. The field plate region 38 comprises a field plate electrode 38.1, e.g. made of polysilicon, and an interlayer dielectric 38.2 isolating it from the drift region 13 and from the gate region 6. Like the field electrode region 35, the field plate region 38 can allow for a field shaping.

Referring to FIG. 2 again, this figure illustrates that a lower part 7.1 of the body contact region 7 is arranged laterally aside the body region 3. Since the body contact region 7 is contained in the diffusion barrier structure 20, it can be brought close to the channel region 3.1. A lateral distance 27 between the diffusion barrier layer 20.1 and the channel region 3.1 is only around 50 nm, which can be advantageous regarding a shielding of the high drain potential.

The body contact region 7 is contacted by a conductive region 8 made of tungsten in this case. The conductive region 8 has a contact area 8.1 forming the electrical contact towards the body contact region 7. To assure a good electrical connection to the body contact region 7 and also to the source region 2, a suicide layer 40 is arranged between the contact area 8.1 and the body contact region 7, as well as between the body contact region 7 and the source region 2. The contact area 8.1 lies vertically above an upper end 25.1 of the channel region 3.19 it is arranged at an upper end 2.1 of the source region 2. Consequently, there is sufficient body contact material below, which can allow for a stable processing, see the general description in detail. The channel region 3.1, which extends between the upper end 25.1 and a lower end 25.2, has a vertical height 26 of around 50 nm.

Referring to FIGS. 3a-h, the processing of the device 1, in particular of the body contact region 7 is explained in further detail. In the situation shown in FIG. 3a, the field electrode trench 36 and the gate trench 37 have already been etched into the drift region 13. The trenches 36, 37 have been filled again, the field electrode region 35 and the field plate region 38 have been formed, and the gate region 6 has been formed in the gate trench 37. From this previous process step, namely from the deposition of the interlayer dielectric 6.2, a layer 44 of the interlayer dielectric material remained at the surface 13.1 of the drift region 13. This layer 44, e.g. an oxide layer, is used as a hard mask 45 subsequently (alternatively, a short low-temperature oxide could be deposited). A thin layer or oxide could be added onto the layer 44 to adjust the thickness of the hard mask to the trench etch if required.

This is shown in FIG. 3b, where a photoresist layer 46 has been deposited on the layer 44 and structured by photolithography. After etching through the layer 44, a body contact region trench 50 is etched into the drift region 13, wherein the layer 44 serves as a hard mask 45 (the photoresist layer 46 could be removed prior to etching into the drift region 13, the trench would be etched due to the selectivity between oxide and silicon). If the topology would be critical, the trenches 36, 37 could be refilled with oxide, combined with a planarization, e.g. CMP. When the body contact region trench 50 has been etched, the diffusion barrier structure 20 is formed at the sidewalls 50.1, 50.3 and the bottom 50.2 of the trench 50.

As shown schematically in the enlarged view, the diffusion barrier structure 20 is formed of alternating silicon sublayers 51.1 and oxygen-doped silicon sublayers 51.2. Between the silicon substrate forming the drift region 13 and the alternating sublayers 51.1, 51.2, a silicon buffer layer 52 can be arranged. Furthermore, a capping layer 53 of epitaxially grown silicon can be placed on the alternating sublayers 51.1, 51.2 (prior to filling the trench completely with epitaxial silicon, see below). It can provide a high carrier mobility in this region. The silicon buffer layer 52 may be relatively thin, e.g. in the range of 2 to 5 nm thick, Both, the silicon buffer layer 52 and the capping layer 53 are optional. In addition to limiting the out-diffusion of the doping, the oxygen-doped silicon sublayers 51.2 of the barrier structure 20 may also improve carrier mobility within the channel region 3.1 of the device 1.

The oxygen-doped silicon sublayers 51.2 of the diffusion barrier structure 20 may be formed by introducing oxygen partial monolayers to a silicon lattice. The oxygen atoms are interstitially placed to minimize disruption of the silicon lattice. Silicon sublayers 51.1 of silicon atoms separate adjacent oxygen partial monolayers (the oxygen-doped silicon sublayers 51.2). The alternating sublayers 51.1, 51.2 may be formed by silicon epitaxy with absorption of oxygen at different steps. For example, temperature and gaseous conditions can be controlled during the epitaxy process to form the oxygen-doped silicon sublayers 51.2, namely the partial oxygen monolayers. Oxygen may be introduced/ incorporated between epitaxial layers of silicon (the silicon sublayers 51.1), e.g. by controlling the introduction of an oxygen precursor into the epitaxy chamber. The resulting diffusion barrier structure 20 includes the oxygen-doped silicon sublayers 51.2 that comprise mainly silicon but have a doped level or concentration level of oxygen alternating with standard epitaxial layers of silicon without oxygen, namely the silicon sublayers 51.1.

Subsequently, the body contact trench 50 is filled up with epitaxially grown silicon 55, see FIG. 3c. In the situation shown there, the photoresist layer 46 has been removed again, the epitaxial silicon 55 projects vertically. By a planarization, for instance CMP, the silicon projecting above can be removed so that the epitaxial silicon 55 lies flush with the upper surface 45.1 of the layer 44 (dotted line).

Figure 3D:
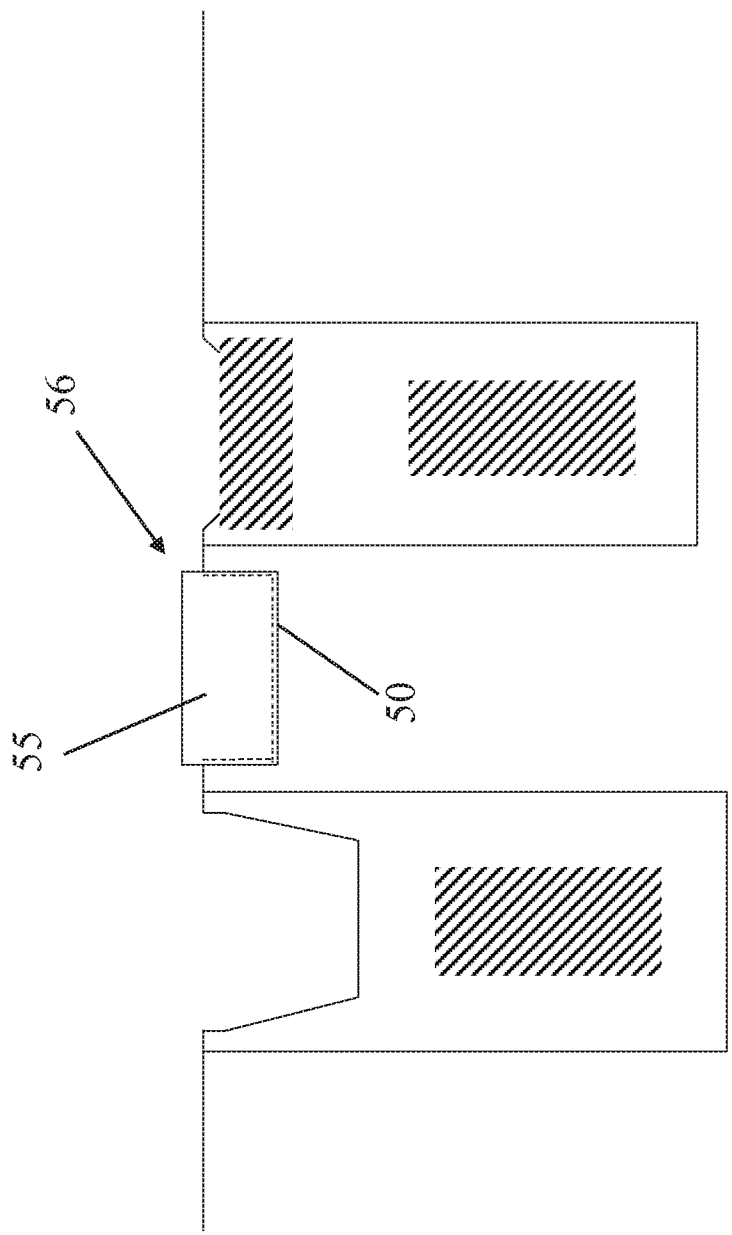

In the process steps shown in FIG. 3d, the layer 44 used as a hard mask 45 has been removed, resulting in a step 56 formed by the epitaxial silicon. As discussed in the general description in detail, the epitaxial silicon 55 could also be doped in situ during the growth. In the example shown here, it has been deposited undoped, and a high dose implant is introduced later on. Prior to that, the implantations for the body region 3 and the source region 2 are performed. The body implant can be introduced without a mask, FIG. 3e illustrates a source mask 60 for the subsequent source implant. Prior to the deposition and structuring of the source mask 60, a screen oxide 59 has been deposited for the subsequent implantations. The source mask 60 shields a central portion 50.4 of the body contact trench 50 from the source implant, defining the source region 2 at the edge.

After removal of the source mask 60, a body contact mask 61 for the high dose implant 63 is formed, see FIG. 3f. The mask 61 defines a certain lateral distance 62 of the high dose implant 63 from the diffusion harrier structure 20. In a subsequent activation step, e.g. thermal annealing, the high dose implant 63 extends up to the diffusion barrier structure 20.

FIG. 3g illustrates a process step after the body contact mask 61 has been removed and an interlayer dielectric 65 has been deposited (after a removal of the screen oxide 59). On top of the interlayer dielectric 65, a mask 66 has been formed, defining the positions of the contact holes 67-69 etched through the interlayer dielectric 65. After a removal of the mask 66, a titanium or titanium/titanium nitride layer 70 is deposited (see FIG. 1). In the contact holes 67-69, this layer serves as a silicide formation layer, the silicide formation is achieved by a subsequent thermal treatment. As shown in FIG. 3h, a metal material filler 66 can be deposited into the contact holes 67-69, forming a respective electrical contact via the respective silicide layer 40, 70, 71. In case of the body contact region 7, the metal material filler 66 forms the conductive region 8 and the contact area 8.1, which lies in a horizontal plane 75.

FIG. 4 gives an overview of some of the process steps in a flow chart, beginning with the etching 80 of the body contact trench 50. After forming 81 the diffusion barrier structure 120 at the bottom 50.2 and the sidewalls 50.1, 50.3, the body contact trench 50 is filled 82 with the epitaxially grown silicon 55, Thereafter, the body region 3 and the source region 2 are formed 83 by implantation (see in detail above). After a doping 84 of the epitaxially grown silicon 55 for forming the body contact region 7, the silicide layer 40 is formed 85. Thereafter, the metal material filler 66 is deposited 86 and forms the conductive region 8.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor transistor device, comprising:
   a source region;
   a body region comprising a vertical channel region;
   a drain region;
   a gate region laterally aside the vertical channel region;
   a body contact region formed by doping;
   a diffusion barrier layer; and
   a conductive region formed of a conductive material,
   wherein the body contact region electrically contacts the body region, the diffusion barrier layer being arranged in between,
   wherein the doping of the body contact region is of the same conductivity type but of higher concentration than a doping of the body region,
   wherein the conductive region has a contact area that forms an electrical contact towards the body contact region, the contact area of the conductive region being arranged vertically above an upper end of the vertical channel region,
   wherein the diffusion barrier layer comprises alternating sublayers of Si and oxygen-doped Si.

2. The semiconductor transistor device of claim 1, wherein the contact area of the conductive region is arranged at an upper end of the source region.

3. The semiconductor transistor device of claim 1, wherein the contact area of the conductive region lies entirely in a horizontal plane.

4. The semiconductor transistor device of claim 1, wherein at least a lower part of the body contact region is arranged laterally aside the body region.

5. The semiconductor transistor device of claim 4, wherein the lower part of the body contact region and the diffusion barrier layer both extend vertically over an entire vertical height of the channel region.

6. The semiconductor transistor device of claim 4, wherein the diffusion barrier layer is arranged at a lateral distance of not more than 80 nm from the channel region.

7. The semiconductor transistor device of claim 1, wherein the channel region has a maximum vertical height of 100.

8. The semiconductor transistor device of claim 1, further comprising an additional diffusion barrier layer that defines the body contact region vertically downwards, wherein the additional diffusion barrier layer is formed at an upper surface of a drift region arranged in between the body region and the drain region.

9. The semiconductor transistor device of claim 8, wherein at least one of the diffusion barrier layer and the additional diffusion barrier layer comprises alternating sublayers of Si and oxygen-doped Si.

10. The semiconductor transistor device of claim 1, wherein the body contact region electrically contacts the body region over the whole height of the channel region with the diffusion barrier layer in between.

11. The semiconductor transistor device of claim 1, wherein the vertical channel region is a portion of the body region that is closest to the gate region, and the vertical channel region does not contact the diffusion barrier layer.

12. The semiconductor transistor device of claim 1, wherein the diffusion barrier layer includes a first vertical portion in contact with the body region, a horizontal portion in contact with a drift region, and a second vertical portion in contact with a field electrode trench.

13. A semiconductor transistor device, comprising:
a source region;
a body region comprising a vertical channel region;
a drain region;
a gate region laterally aside the vertical channel region;
a body contact region formed by doping;
a diffusion barrier layer; and
a conductive region formed of a conductive material,
wherein the body contact region electrically contacts the body region, the diffusion barrier layer being arranged in between,
wherein the doping of the body contact region is of the same conductivity type but of higher concentration than a doping of the body region,
wherein the conductive region has a contact area that forms an electrical contact towards the body contact region, the contact area of the conductive region being arranged vertically above an upper end of the vertical channel region,
wherein a lower part of the body contact region and the diffusion barrier layer both extend vertically over an entire vertical height of the vertical channel region.

14. The semiconductor transistor device of claim 13, wherein the vertical channel region is a portion of the body region that is closest to the gate region, and the vertical channel region does not contact the diffusion barrier layer.

15. The semiconductor transistor device of claim 13, wherein the diffusion barrier layer includes a first vertical portion in contact with the body region, a horizontal portion in contact with a drift region, and a second vertical portion in contact with a field electrode trench.

16. A semiconductor transistor device, comprising:
a source region;
a body region comprising a vertical channel region;
a drain region;
a gate region laterally aside the vertical channel region;
a body contact region formed by doping;
a diffusion barrier layer; and
a conductive region formed of a conductive material,
wherein the body contact region electrically contacts the body region, the diffusion barrier layer being arranged in between,
wherein the doping of the body contact region is of the same conductivity type but of higher concentration than a doping of the body region,
wherein the conductive region has a contact area that forms an electrical contact towards the body contact region, the contact area of the conductive region being arranged vertically above an upper end of the vertical channel region
wherein the diffusion barrier layer includes a horizontal portion between the body contact region and a drift region that prevents an outdiffusion of a highly concentrated dopant of the body contact region vertically downwards into the drift region.

17. The semiconductor transistor device of claim 16, wherein the vertical channel region is a portion of the body region that is closest to the gate region, and the vertical channel region does not contact the diffusion barrier layer.

18. The semiconductor transistor device of claim 16, wherein the diffusion barrier layer also includes a first vertical portion in contact with the body region, and a second vertical portion in contact with a field electrode trench.

* * * * *